(12) United States Patent
Rootz et al.

(10) Patent No.: US 6,358,095 B1
(45) Date of Patent: Mar. 19, 2002

(54) CONSOLIDATED AUTOMATIC SUPPORT SYSTEM (CASS) FLEXIBLE EXCHANGE ADAPTER AND INTERFACE DEVICE

(75) Inventors: William F. Rootz, Chesterfield; Steven A. Wegener; Randall L. Marion, both of St. Charles; Kenneth J. Scheve, Florissant; James J. Cook, Bridgeton, all of MO (US); Brett E. McSparin, Glen Carbon, IL (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 09/619,374

(22) Filed: Jul. 19, 2000

(51) Int. Cl.7 .............................................. H01R 25/00
(52) U.S. Cl. ...................................................... 439/638
(58) Field of Search ................................ 439/638, 912, 439/482, 620

(56) References Cited

U.S. PATENT DOCUMENTS

| | | | |
|---|---|---|---|
| 4,676,572 A | | 6/1987 | Booker |
| 4,816,751 A | * | 3/1989 | Seiichi et al. ................ 439/912 |
| 5,354,204 A | * | 10/1994 | Hughes ........................ 439/638 |
| 5,458,501 A | | 10/1995 | Lazaro, Jr. et al. |
| 5,491,418 A | * | 2/1996 | Alfaro et al. ................. 439/620 |
| 5,541,863 A | | 7/1996 | Magor et al. |
| 5,664,810 A | | 9/1997 | Zielinski |
| 5,722,846 A | | 3/1998 | Lazaro, Jr. |
| 5,765,957 A | | 6/1998 | Connell |
| 5,989,065 A | | 11/1999 | Lazaro, Jr. |

* cited by examiner

Primary Examiner—Brian Sircus
Assistant Examiner—Phuong K T Dinh
(74) Attorney, Agent, or Firm—Harness Dickey & Pierce P.L.C.

(57) ABSTRACT

A two-component adapter assembly provides a less expensive, less labor-intensive alternative for interfacing between a General Purpose Interface of a CASS (Consolidated Automatic Support System) and a military electronic unit under test, such as a weapons replaceable assembly (WRA) or a shop replaceable assembly (SRA). The adapter assembly includes a first universal adapter component having a first universal connection assembly suitable for attachment to the General Purpose Interface and a second universal connection assembly disposed in electrical communication with the first universal connection assembly. Since the first universal adapter component includes expensive gold-plated attachment sockets for connection to the General Purpose Interface, the invention contemplates using only a single universal version of this component. The adapter assembly further includes a second adapter component suitable for electrically interfacing between the first universal adapter component and the electronic unit under test. The second adapter component includes a printed circuit board interface that can be manufactured less expensively in many customized varieties for interfacing with many different electronic units under test. Different customized versions of the second adapter component can therefore be removably attached between the first universal adapter component and the unit under test. This arrangement results in production and maintenance cost and labor savings, compared to the prior use of many single-component adapters that had to be customized individually and expensively for each particular type of unit under test.

18 Claims, 6 Drawing Sheets

CONSOLIDATED AUTOMATIC SUPPORT SYSTEM (CASS) FLEXIBLE EXCHANGE ADAPTER AND INTERFACE DEVICE

TECHNICAL FIELD

This invention relates generally to electrical adapters, connectors and interfaces, and more particularly to an adapter and interface device for interfacing a printed wiring board (PWB) from an electronic assembly or unit under test (UUT) to the General Purpose Interface (GPI) of a diagnostic test station, such as a CASS (Consolidated Automatic Support System) station.

BACKGROUND OF THE INVENTION

The CASS (Consolidated Automatic Support System) diagnostic test system is a standardized suite of automatic military electronics test equipment. It is designed to perform full electronics testing, in the nature of functional tests, calibration, fault detection and isolation, on defense equipment electronic systems in aircraft, aircraft carriers, submarines and other land, air and sea military assets. The CASS system is deployed in different locations, typically military aircraft electronics development and manufacturing centers, naval air stations and aircraft carriers. It is available in various different configurations, depending on the type of electronic defense equipment being tested.

Use of the CASS system typically occurs after onboard built-in test, diagnostic equipment ("BIT") detects or "flags" a fault in a particular aircraft electronics system. The BIT is typically able to detect faults at the module level of the electronics system, known as the "Weapons Replaceable Assembly," or "WRA." Failure data generated by the BIT advises service and maintenance personnel that a failure has occurred within a particular WRA and that testing and repair of that particular module is required.

The WRA modules are assemblies, typically having the external form of military-grade metallic boxes, each containing multiple removable printed circuit boards or cards, called "shop replaceable assemblies" ("SRAs"). Between 5 and 45 such SRAs are typically located within a particular WRA. The detection of a failure in a selected WRA by an onboard BIT indicates one or more failures in one or more SRAs within that WRA. Although the BIT is occasionally able to detect faults beyond the WRA level to the SRA level, typically, the BIT is strictly used for fault detection at the WRA level. More precise fault detection at the SRA level is performed by removing the WRA from service and testing the electronic systems within that particular WRA at a CASS station.

The CASS station serves dual purposes in the testing of the WRA and SRA assemblies. First, the CASS station is able to test a WRA as a single electronic system (an intermediate level, or "I-level," test), in greater detail than the BIT test. In particular, the CASS station testing of the WRA as a single electronic system identifies individual SRAs having defective electronic components. The CASS station is then also able to test the SRAs on an individual basis, to detect faults within the actual electronic components making up a particular SRA, such as chips, integrated circuits, resistors, capacitors, etc. (commonly referred to as the "piece parts"). Typically, the CASS station testing is able to identify a small group (perhaps 5 to 7) of individual components, or "piece parts," and sometimes a single component, within a particular SRA that is defective and therefore in need of replacement.

Thus, the overall method for repairing detected WRA failures using a CASS station involves first testing a WRA as a single system to determine defective SRAs, removing any defective SRAs from a particular WRA, testing these defective SRAs individually to detect individual defective components, replacing the defective components and reinstalling the repaired SRAs within the WRA. Since the WRA modules are typically removable by hand by disconnecting them from the wiring system of the particular military asset involved, they can be brought to a CASS station for diagnosis, repaired as needed and then reinstalled in the military asset.

Because the CASS system is intended to be a universal testing system for many different types of electronic components, it includes a universal-type electrical-mechanical interface in the nature of a main General Purpose Interface ("GPI"). The GPI is a vertical panel on the front of the CASS station containing over 1400 (typically gold-plated) connection pins of three primary types: (1) power pins, which handle high current, and are typically expensive; (2) small signal or small amperage pins, which are less expensive; and (3) coax pins, which are expensive. The CASS station GPI pins are referred to as "female" connectors in that they engage a plurality of sockets organized in the form of a connector box, or "interface device" ("ID") that is attached as the "male" connector set onto all or part of the CASS station GPI.

The interface device, or "ID," is the type of device currently used to provide electrical and mechanical connection between a unit under test, which can be either a WRA or an SRA, and the 1400+pins of the CASS station GPI. The individual WRAs removed from military assets for CASS station testing typically include three to five "male" socket connector assemblies usually having a total of from about 10 to about 120 sockets that must be connected to the CASS station GPI pins in a particular arrangement to accomplish the desired testing functions. The individual SRAs that are removed from WRAs for CASS station testing typically each include at least one "male" and one "female" connector assembly located directly on the SRA printed circuit board. One or more are in the form of a functional connector used to connect the SRA to the WRA on its interior. Also provided is a "female" test connector, also located directly on the SRA printed circuit board, and provided for attachment to diagnostic systems such as the CASS system. Where both kinds of connectors are provided, use of both the test and functional connectors is preferred, because this arrangement provides supplemental advantages for isolating faults. When the SRA board does not include a test connector, diagnostic testing with the CASS system is performed by connecting to the functional connector or connectors alone.

Therefore, any suitable interface devices for connecting WRAs or SRAs to a CASS station GPI for diagnostic testing purposes must interface between the various "female" pins of the CASS station GPI and either the "male" WRA socket connector assemblies or the "male" SRA test and functional socket connector assemblies. However, since the particular types, sizes and configurations of the "male" sockets located upon the numerous various types of WRAs and SRAs vary widely, many such interface devices must be prepared for interfacing from the CASS GPI to these various WRAs and SRAs. Even though a single interface device of the type currently used can sometimes be used for interfacing with several different WRAs or SRAs (typically, a single interface device can be used with between 1 and 10 separate units under test), current interface devices must still be custom-made in large numbers (by the hundreds) for interfacing between the CASS station GPI and the many WRAs and SRAs that need to be tested. Each such custom-made interface device includes a "female" connector for attachment to a unit under test (WRA or SRA), a large amount of internal wiring with discrete soldered or crimped wire connections (which is expensive, can fail during use in the field and is labor-intensive to build and check) and expensive gold-plated "male" socket connectors for attachment to the gold-plated "female" CASS GPI pin interface.

Interface devices of the type currently used for attachment to a CASS station GPI typically employ two methods for attaching wires within each particular device to the pins, sockets or other interfacing connectors used. The use of printed wiring board traces provides high reliability and performance with reduced production cost. However, printed wiring boards are not always practical during the prototype phase because modifying printed circuit board traces is difficult. Wirewrap technology, however, is another method of connecting wires within an interface device quickly and cheaply, where a technician uses a special wirewrap tool that physically strips insulation from the wire and binds the conductor around a wire wrap post attached to the connector. Multiple wires wrapped to a particular post completes the connection. The wirewrap technology method is an excellent means to produce and modify engineering prototypes because it allows the engineer to change the design easily. Therefore, an important aspect of suitable interface devices for connecting WRAs or SRAs to a CASS station GPI for diagnostic testing purposes is the flexibility to accommodate both the printed wiring board and wirewrap approaches.

In addition, each GPI pin is connected internally to one or more wires within the CASS station. When a GPI pin is bent or broken, the repair requires entering the inside of the GPI interface device, thereby breaking the quality seal of the device. Wires attached to the failed pin are removed, the new pin reattached to the appropriate wires, and the interface device is re-inspected and re-sealed by a quality person. Such repairs, which may be increased in frequency, due to repetitive connection and disconnection at the GPI, can also be time-consuming, labor intensive and expensive.

In summary, the expense of producing numerous interface devices, each having numerous gold-plated connectors, along with the need for significant maintenance to repair internal disconnections and broken wires caused by general movement of such interface devices during use, can make this custom type of interface device disadvantageous.

Thus, there is a need for a simpler, less expensive, way to produce and maintain an adapter for interfacing the General Purpose Interface (GPI) of a diagnostic testing system, such as the CASS system, to a unit under test for military electronics applications.

SUMMARY OF THE INVENTION

The present invention replaces the concept of providing numerous expensive interface devices for attachment to the CASS station GPI with a new, two-component attachment assembly. The first component of the assembly is a single adapter (called a "FLEX Adapter") that includes the typically expensive "male" connection sockets for attachment to the CASS station GPI and extensive internal wiring that was used previously in many different versions of interface devices. However, now, only one version of the FLEX Adapter need be made. The second component is an inexpensive interface test adapter, or "ITA," that includes a customized printed circuit board for interfacing between the FLEX Adapter and a particular unit under test, such as a WRA or SRA. Since the ITA is relatively easy and inexpensive to produce and maintain, this second component of the new two-component attachment assembly can be custom-made in large numbers corresponding to the particular connection requirements of the various WRAs and SRAs. Thus, numerous, less expensive and less maintenance-demanding ITAs can be employed in interchangeable use with the single, more expensive, FLEX Adapter to connect all the varieties of WRAs and SRAs to be tested to the CASS system.

Thus, the new connection assembly provides a break from the traditional high density interface device ("ID") that would otherwise be required to complete the interface between the CASS station and a unit under test. The new FLEX Adapter includes special dual ended spring loaded pins (patented by Virginia Panel Corporation under U.S. Pat. Nos. 5,227,718, 5,420,519 and 5,576,631) that push and twist against printed circuit lands on the ITA, making the electrical connection.

An advantage of the present invention is to convert the traditional expensive and labor-intensive pin and socket interface of an automatic support system, such as the CASS diagnostic testing system, to a less expensive and less labor-intensive printed wiring board interface, so that a less expensive and less labor-intensive printed wiring board interface device can then be used for connection to the printed wiring board interface of a unit under test.

Another advantage of the present invention is to provide an extension of an automatic support system, such as the CASS diagnostic testing station, in the form of an adapter between the support station and a unit under test that is less expensive to produce than the current pin and socket adapters.

Yet another advantage of the present invention is to provide an adapter between an automatic support system, such as the CASS diagnostic testing station, and a unit under test that drastically reduces the amount of internal wiring which can fail during use in the field.

Yet another advantage of the present invention is to provide an adapter between an automatic support system, such as the CASS diagnostic testing station, and a unit under test that takes advantage of the reliability and low expense of printed circuit board systems in electronic testing applications.

A further advantage of the present invention is to provide an adapter between the CASS station and a unit under test that is easier and less expensive to repair and maintain, because it can be repaired from the front without sophisticated tools, thereby resulting in a labor savings.

Yet another advantage of the present invention is to provide an adapter between the CASS station and a unit under test that includes sufficient flexibility to accommodate both the printed wiring board and wirewrap technology approaches for connecting wires in the adapter.

BRIEF DESCRIPTION OF THE DRAWINGS

The various advantages of the present invention will become apparent to one skilled in the art by reading the following specification and subjoined claims and by referencing the following drawings in which:

DETAILED DESCRIPTION OF THE PREFERRED EMBODIMENTS

It should be understood that while this invention is described in connection with particular examples, the scope of the invention need not be so limited. Rather, those skilled in the art will appreciate that the following teachings can be used in a much wider variety of applications than the examples specifically mentioned herein.

Figure 1:
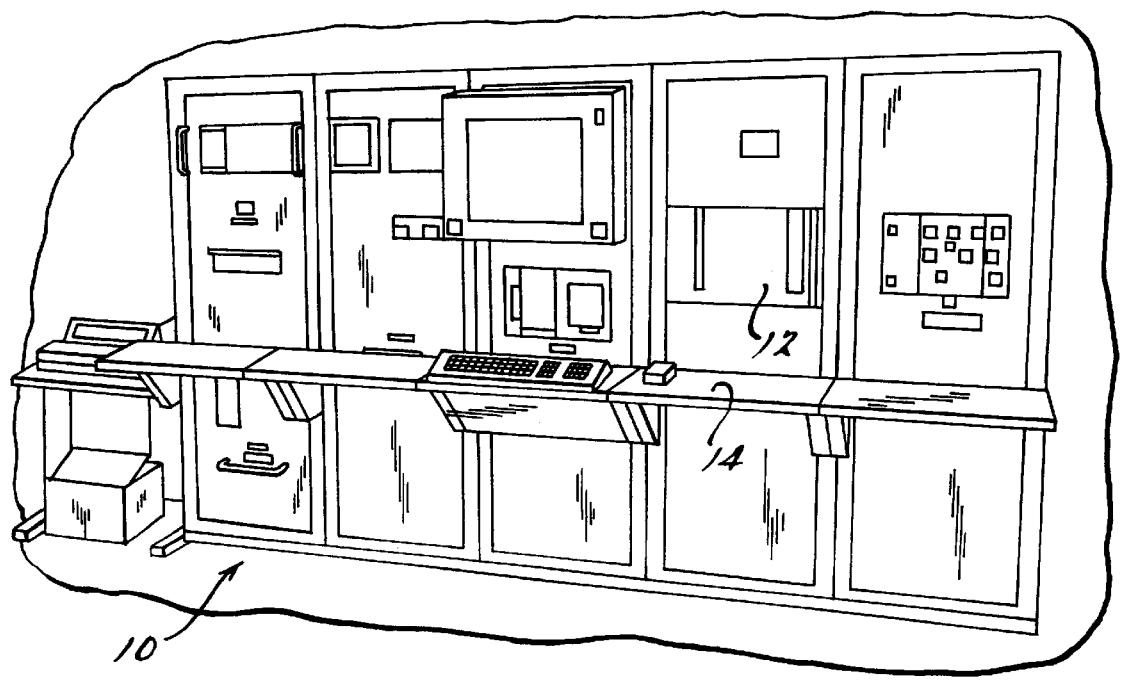
FIG. 1 is a front perspective view illustrating one configuration of the CASS diagnostic test system.

Referring now to FIG. 1, there is shown a CASS diagnostic testing station, generally at 10. The CASS station 10 includes a General Purpose Interface ("GPI") 12 to which a unit under test ("UUT") (not shown) can be connected for diagnostic testing purposes. Attachment to the General Purpose Interface 12 can be accomplished by direct attachment of an interface device ("ID") directly to the General Purpose Interface 12. Alternatively, attachment to the General Purpose Interface 12 can be accomplished by by placing the unit under test upon the work table 14 located on the front of the CASS station 10 and connecting the unit to the General Purpose Interface 12 through the use of connection cables or other suitable devices.

Figure 2:
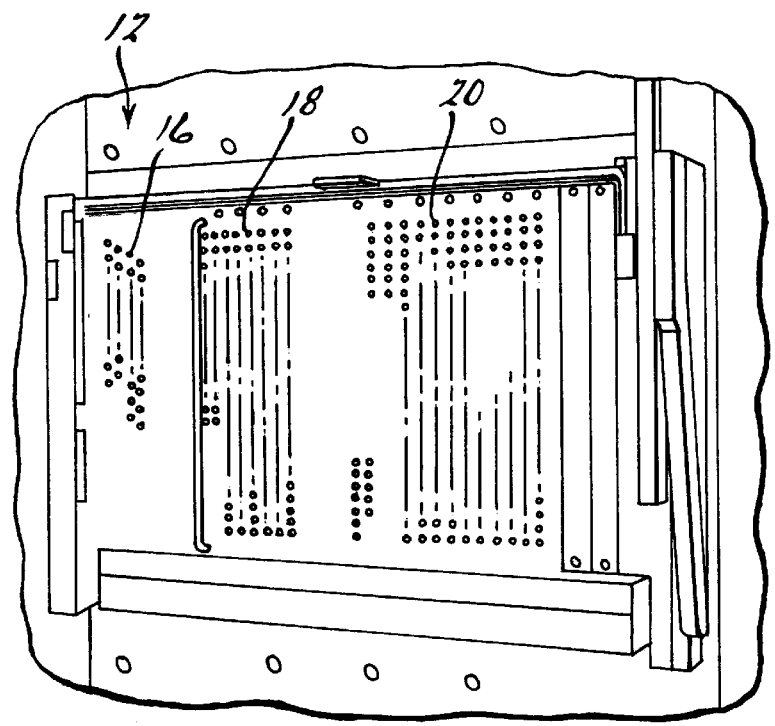
FIG. 2 is a front perspective view illustrating the General Purpose Interface (GPI) of the CASS system.

Referring now to FIG. 2, there is shown a close-up front perspective view of the General Purpose Interface 12. The General Purpose Interface 12, as mentioned above, contains over 1400 connection pins of three primary types: power pins 16, small signal pins 18 and coax pins 20. The power pins 16, small signal pins 18 and coax pins 20 are all referred to as "female" connectors in that they engage a plurality of sockets that are typically attached as a "male" connector set onto all or part of the General Purpose Interface 12.

Figure 3:
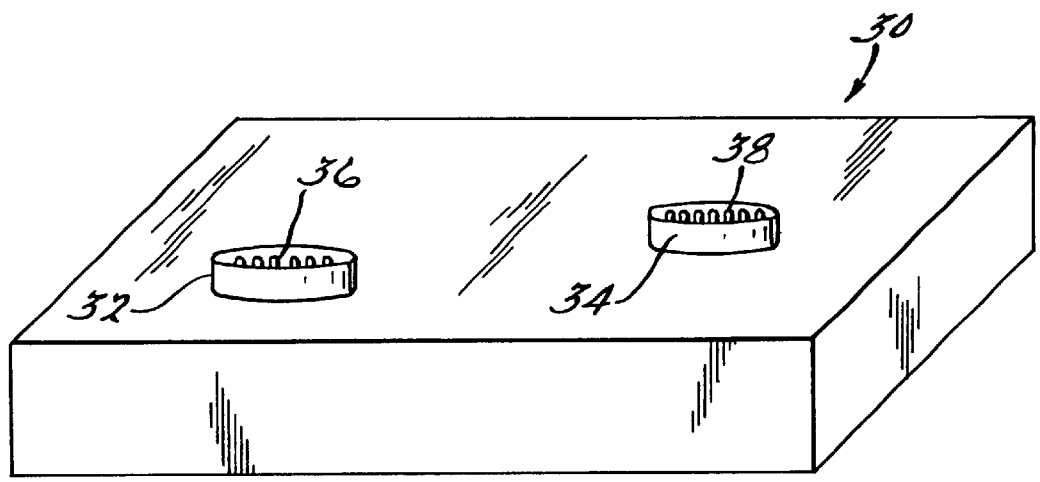
FIG. 3 is a top perspective view illustrating a typical weapons replaceable assembly (WRA) removed from a military asset for testing purposes using the CASS diagnostic testing system.

Referring now to FIG. 3, there is shown a top perspective view illustrating a typical weapons replaceable assembly ("WRA"), generally at 30. The weapons replaceable assembly 30 is shown to generally be in the form of a military grade metallic box. Each weapons replaceable assembly 30, as previously described, contains multiple removable printed circuit boards or cards, called shop replaceable assembles ("SRA" s) (not shown). The weapons replaceable assemblies 30 are installed within military assets, such as aircraft, and are connected to the electronic system of the particular military asset through one or more "male" connector assemblies, such as those shown at 32 and 34. The male connector assemblies 32 and 34 contain connection pins 36 and 38, which engage suitably arranged corresponding sockets of an on-board military-grade connector assembly. Thus, the connector assemblies 32 and 34 are the connector assemblies that must be interfaced with the General Purpose Interface 12 of the CASS station 10 shown in FIGS. 1 and 2 for diagnostic testing of the weapons replaceable assembly 30 to take place.

Figure 4:
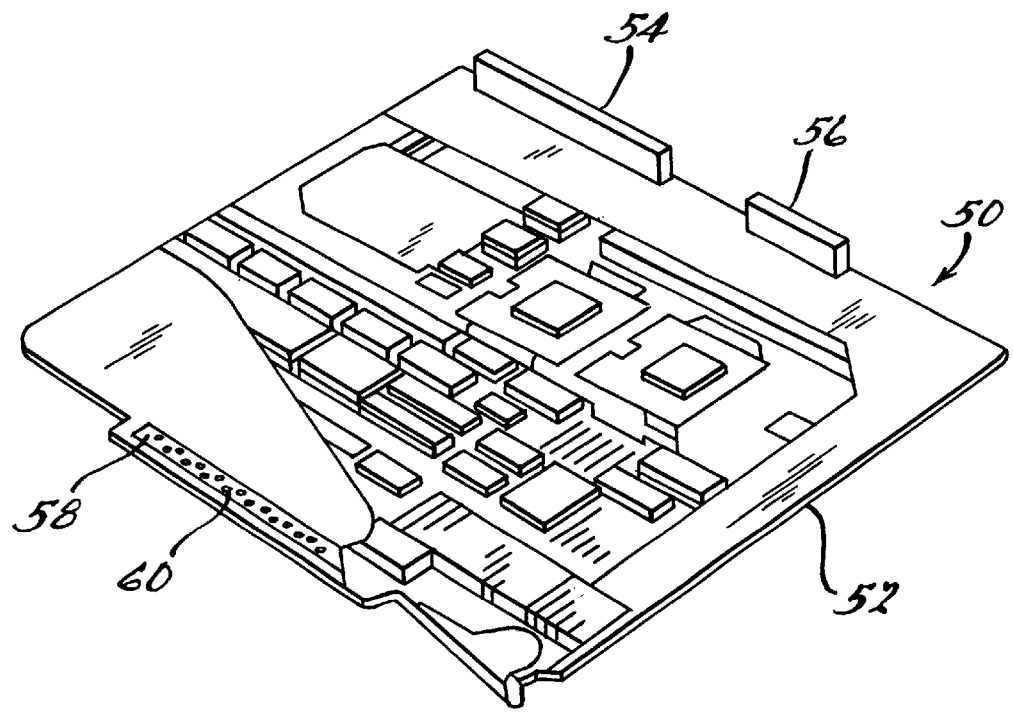
FIG. 4 is a top perspective view illustrating a typical shop replaceable assembly (SRA), removed from a weapons replaceable assembly (WRA), for testing purposes using the CASS system.

Referring now to FIG. 4, there is shown a top perspective view illustrating a typical shop replaceable assembly ("SRA"), generally at 50. The shop replaceable assembly 50 is of the type located within the weapons replaceable assembly 30 shown in FIG. 3. Thus, the shop replaceable assembly 50 is the type of assembly removed from the weapons replaceable assembly 30 shown in FIG. 3 for the second level of diagnostic testing which determines actual defective electronic components in the weapons replaceable assembly 30. The shop replaceable assembly 50 includes a printed circuit board 52 upon which the various military electronics components are disposed. Attached to the printed circuit board 52 are two functional connectors, 54 and 56. The functional connectors 54 and 56 are used for connecting the shop replaceable assembly 50 to the interior wiring of the weapons replaceable assembly 30 when the shop replaceable assembly 50 is positioned in its correct location within the weapons replaceable assembly 30. Although two functional connectors 54 and 56 are shown, it will be appreciated that the shop replaceable assembly 50 may alternatively include only one, or more than two, functional connectors. The functional connectors 54 and 56 are generally in the form of "male" connector assemblies, containing a plurality of pins (not shown) in a specified arrangement.

The shop replaceable assembly 50 also includes a test connector 58, located at the opposite end of the printed circuit board 52, relative to the functional connectors 54 and 56. The test connector 58 is shown to include a plurality of connection pins 60, which form a "female" socket connector assembly. The test connector 58 is provided as a supplemental connection assembly for attachment directly to diagnostic systems such as the CASS system. Some shop replaceable assemblies do not include a test connector 58. However, where both kinds of connectors are provided, use of both the test connector 58 and functional connectors 54 and/or 56 is preferred for improving the ability to detect and isolate faults, as previously described. Thus, the functional connectors 54 and 56 and the test connector 58 provide the interface locations for connection to the General Purpose Interface 12 of the CASS station 10 for diagnostic testing purposes.

Figure 5:
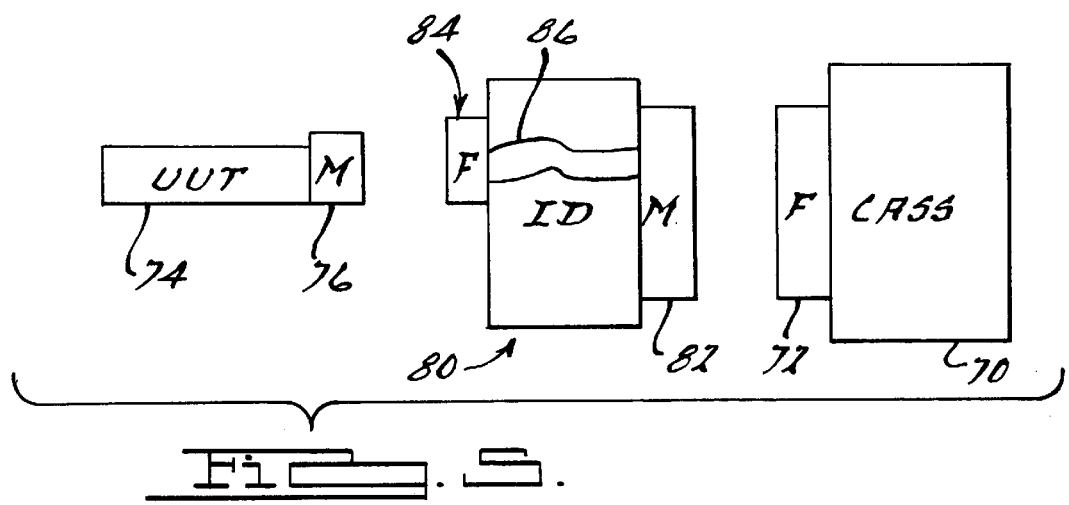
FIG. 5 is a schematic diagram illustrating the prior art method of connecting a unit under test (in the form of a WRA or SRA) to the GPI of a CASS station for testing.

Referring now to FIG. 5, there is shown a schematic diagram illustrating the prior art method of connecting a unit under test (in the form of a weapons replaceable assembly, such as 30, or a shop replaceable assembly, such as 50) to the General Purpose Interface 12 of a CASS station 10. Specifically, FIG. 5 shows that a CASS station 70 includes a General Purpose Interface, designated at 72. The "F" located in the block representing the General Purpose Interface 72 is meant to designate that the General Purpose Interface 72 is a "female" connector assembly. As explained above, this "female" connector assembly for the General Purpose Interface 72 is the collection of 1400+ pins through which testing functions are performed. As also explained above, the 1400+ pins of the General Purpose Interface 72 are typically gold-plated, and are thus expensive. FIG. 5 also shows a unit under test, generally at 74, which may be a weapons replaceable assembly of the type shown at 30 in FIG. 3, or a shop replaceable assembly of the type shown at 50 in FIG. 4. The unit under test 74 is shown to include a printed wiring board interface 76, which may effectively represent the male connector assembly 32 or 34 from FIG. 3 or the functional connectors 54 or 56 or the test connector 58 from FIG. 4. Thus, the printed wiring board interface 76 may include connection pins 36 or 38 from FIG. 3, connection pins 60 from FIG. 4 or the connection pins not shown but associated with the functional connectors 54 or 56. The printed wiring board interface 76 is thus the interface which must be connected to the General Purpose Interface 72 for testing functions to take place. In any of these arrangements, the printed wiring board interface 76 is shown to have an "M" designation, indicating that this connector is considered to be of a "male" configuration.

In the prior art arrangement shown in FIG. 5, an interface device 80 has been used for interfacing between the printed wiring board interface 76 and the General Purpose Interface 72. Thus, the interface device 80 must include a universal male connector assembly 82 which is able to attach correctly to the General Purpose Interface 72. The "M" designation on the universal male connector assembly 82 is intended to show that this component is in the form of a "male" socket-type assembly for engaging the 1400+pins of the General Purpose Interface 72, which is designated as a "female" assembly. The interface device 80 also must include a customized female connector assembly 84 for engagement with the male printed wiring board interface 76 of the particular unit under test 74. Because the printed wiring board interface 76 can take on many different forms (in the hundreds), depending on the particular configuration of the unit under test 74, the customized female connector assembly 84 must also be provided in hundreds of varieties to accomplish the interface function with the unit under test 74. For this reason, hundreds of different versions of the interface device 80 must currently be made in a customized manner for interfacing different units under test 74 with the General Purpose Interface 72 of the CASS station 70. Each customized version of the interface device 80, however, has an expensive universal male connector assembly 82 in common. In each customized configuration of the interface device 80, numerous wires 86 must be installed within the interface device 80 during its manufacture for ensuring the proper connections between the universal male connector assembly 82 and the customized female connector assembly 84. As previously described, the multiplicity of wires 86 within the interface device 80 is a labor-intensive arrangement both in production and in maintenance. This is because during use in the field, many of the wires 86 can become dislodged from their crimped or soldered connections at either end, or they can become broken during use. Thus, the custom manufacture and use of numerous interface devices 80 tends to be an expensive proposition.

Figure 6:
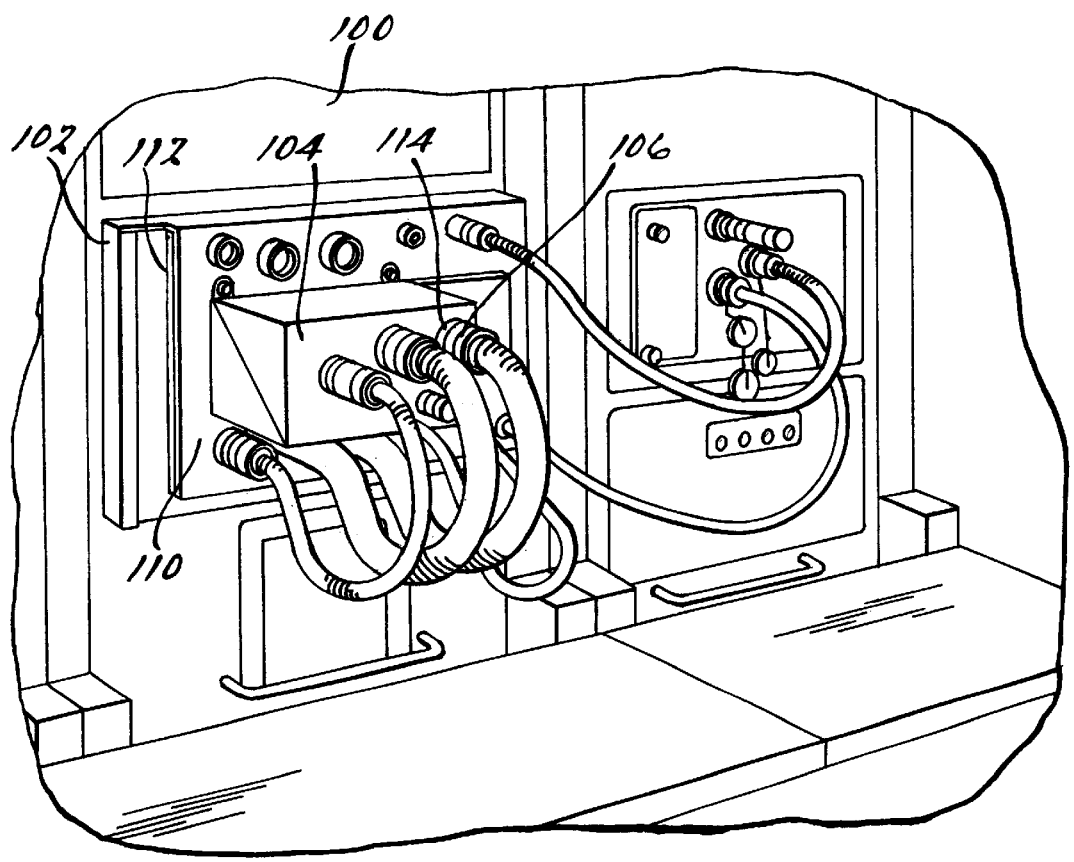
FIG. 6 is a perspective view illustrating an example of the prior art adapter which must be used for connecting the printed wiring board interface of a typical unit under test (in the form of a WRA) to the GPI of a CASS station for testing.

Referring now to FIG. 6, there is shown a perspective view illustrating an example of the prior art adapter arrangement schematically shown in FIG. 5. Specifically, FIG. 6 shows a CASS station generally at 100, including a General Purpose Interface at 102. A unit under test 104 is provided as a weapons replaceable assembly, such as that shown at 30 in FIG. 3. The unit under test 104, in the form of a weapons replaceable assembly, includes a male connector assembly 106, which may be substantially similar to the male connector assembly 32 or 34 from FIG. 3. An interface device 110 of the prior art is shown to include a universal male connector assembly 112 for connection to the General Purpose Interface 102, in similar manner as described above. Also, the interface device 110 includes a customized female connector assembly 114 for attachment to the male connector assembly 106. Internally, the interface device 110 includes customized wiring (not shown) for connecting the universal male connector assembly 112 with the customized female connector assembly 114 in the required way. Again, the current large variety of units under test 104 requires that numerous different customized versions of the interface device 110 be made for attachment thereto.

Figure 7:
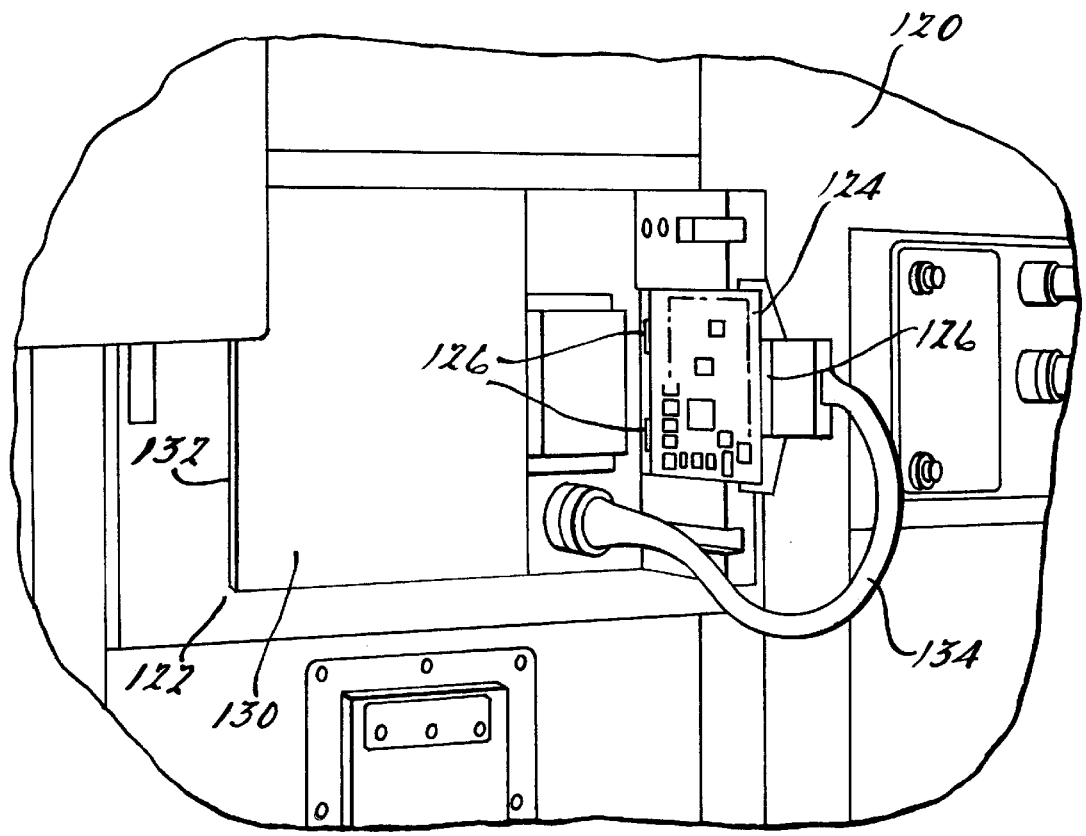
FIG. 7 is a perspective view illustrating an example of the prior art adapter which must be used for connecting the printed wiring board interface of a typical unit under test (in the form of an SRA) to the GPI of a CASS station for testing.
Figure 8:
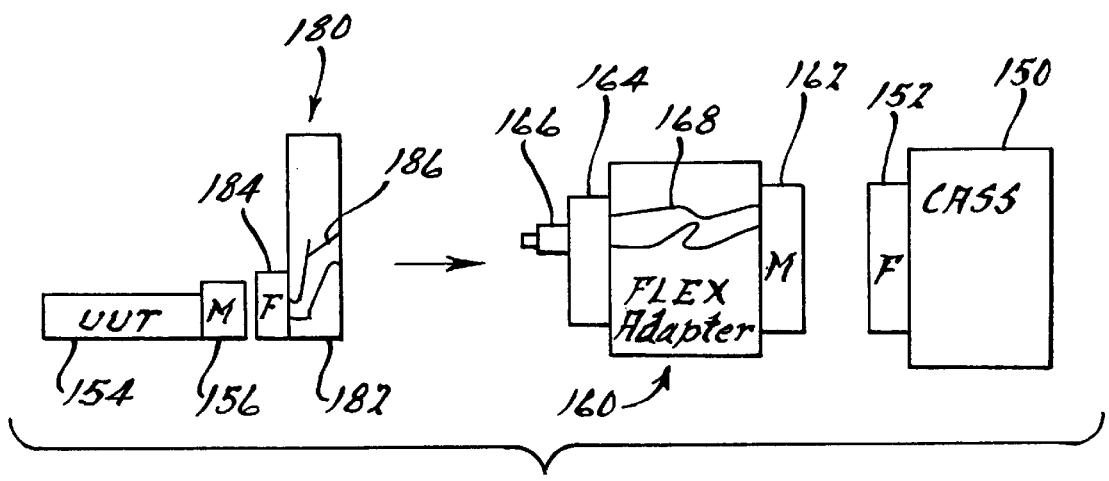
FIG. 8 is a schematic diagram illustrating the new method of connecting a unit under test (in the form of a WRA or SRA) to the GPI of a CASS station for testing, according to an embodiment of the present invention.
Figure 9:
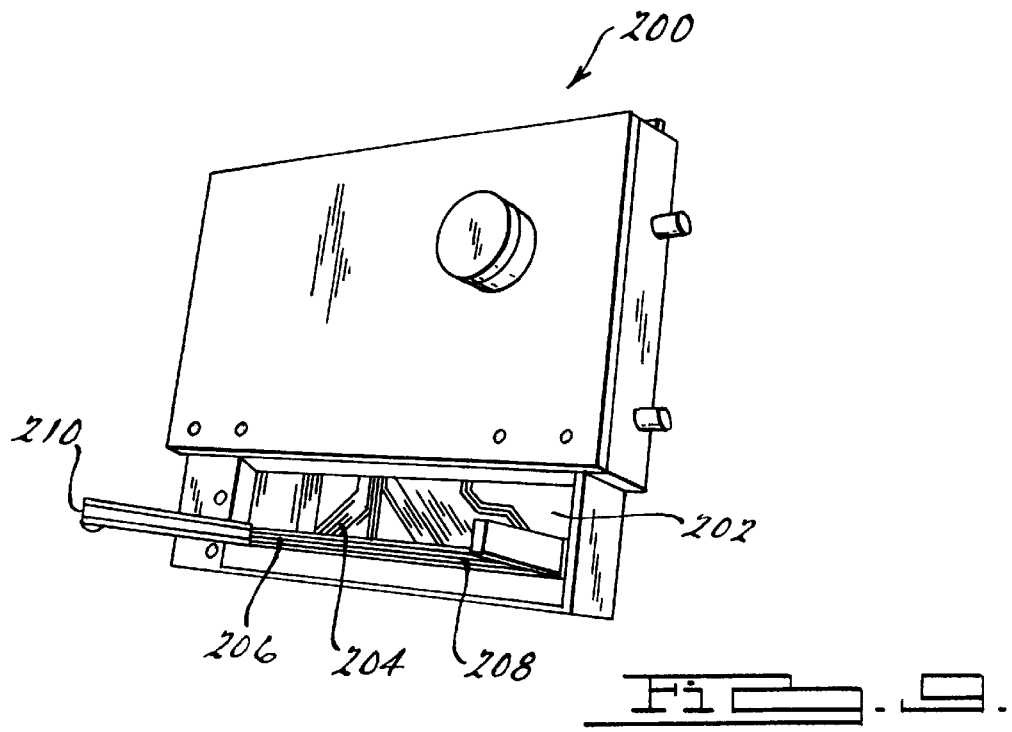
FIG. 9 is a front perspective view illustrating the interface test adapter ("ITA") of the present invention that includes a customized printed circuit board for interfacing between the the FLEX Adapter and a particular unit under test, such as a WRA or SRA.

Referring now to FIG. 7, there is shown a perspective view illustrating an example of the prior art adapter arrangement which must presently be used for connecting the printed wiring board interface of a typical unit under test (in the form of an SRA) to the General Purpose Interface of a CASS station for testing. Specifically, FIG. 7 shows a CASS station generally at 120, having a General Purpose Interface 122, in similar manner as before. A unit under test 124 is provided, this time in the form of a shop replaceable assembly ("SRA"), such as that shown at 50 in FIG. 4. The unit under test 124, in this arrangement, thus includes multiple printed wiring board interfaces 126, which represent the functional connectors 54 and 56 and the test connector 58 from FIG. 4. In similar manner as before, an interface device 130 is provided, which includes a universal male connector assembly 132 for attachment to the General Purpose Interface 122. Also, in this current arrangement, it can be seen a customized female connector assembly 134 must be provided, this time in the form of a customized cable which attaches to one of the three forms of printed wiring board interfaces 126 (representing the test connector 58). Referring now to FIG. 8, there is shown a schematic diagram illustrating the new method of connecting a unit under test in the form of a weapons replaceable assembly (WRA) or shop replaceable assembly (SRA) to the General Purpose Interface of a CASS station for testing, according to an embodiment of the present invention. In this new arrangement, the CASS station is again schematically shown at 150 and includes a General Purpose Interface 152. Again, the General Purpose Interface 152 includes a "F", representing the 1400+ pin interface arrangement. A unit under test is again shown, at 154, which may, in similar manner as before, represent either a weapons replaceable assembly of the type shown at 30 in connection with FIG. 3 or a shop replaceable assembly of the type shown at 50 in FIG. 4. The unit under test 154 includes a connector assembly 156, which may represent a male connector assembly 32 or 34 (for the WRAs) from FIG. 3 or a functional connector 54 or 56 or a test connector 58 (for the SRAs) from FIG. 4. In any event, the "M" designation on the connector assembly 156 is intended to designate that the connector assembly 156 is considered a male assembly which includes the corresponding connection pins 36 or 38 or connection pins 60.

In place of the interface device 80 shown in FIG. 5, the present invention provides a two-component adapter system for accomplishing the connections in a less expensive, less labor and maintenance-intensive manner. Specifically, this two-component adapter system eliminates the expensive reproduction of that portion of the adapter that is most expensive, namely, the gold-plated male connection socket assembly which mates with the 1400+ female connection pin assembly on the General Purpose Interface 152 (or 12). Thus, a first universal adapter component, or FLEX ("FLexible EXchange") Adapter 160 is provided, having a first universal male connection assembly 162 for attachment to the General Purpose Interface 152. Since the universal male connection assembly 162 includes gold-plated sockets that are typically expensive, the FLEX Adapter 160 is intended to be a single universal connector that is an extension of the CASS station 150 and is used universally for testing purposes. Accordingly, only one version of the FLEX Adapter 160 need be made. The FLEX Adapter 160 further includes a second universal connection assembly in the form of a spring pin assembly 164 which includes a plurality of special dual-ended spring loaded pins (patented by Virginia Panel Corporation under U.S. Pat. Nos. 5,227,718, 5,420,519 and 5,576,631). The spring pin assembly 164 is intended to be a less expensive, universal and more adaptable connection device than the expensive pin-and-socket General Purpose Interface 152 of the CASS station 150. The FLEX Adapter 160 is also shown to include a plurality of electrical wires 168 for connecting the universal male connection assembly 162 with the universal spring pin assembly 164.

The universal nature of the single, more expensive, FLEX Adapter 160, allows the customized component of this new, two-component attachment assembly to be a second adapter component, namely, an inexpensive interface test adapter, or "ITA", shown generally at 180. The interface test adapter 180 includes a customized printed circuit board 182 for interfacing between the FLEX Adapter 160 and the unit under test 154. The interface test adapter 180 also includes one or more female connection assemblies 184, designated generically for purposes of this schematic, but which will be described in more detail below. The connection assembly or assemblies 184 are suitable for attachment at one or more locations upon a particular unit under test 154. In the case where the unit under test 154 represents a weapons replaceable assembly, such as that shown at 30 in FIG. 3, the connection assembly 184 may preferably take on the form of a cable having a suitable end connector for attachment to the male connector assembly, such as that shown at 32 or 34 in FIG. 3. In the case where the unit under test 154 is a shop replaceable assembly, such as that shown at 50 in FIG. 4, the connection assembly 184 may take on multiple forms, such as the two functional connectors 54 and 56 and the test connector 58 shown in FIG. 4. Thus, it will be appreciated that the designation for the connection assembly 184 is intended to encompass as many particular connection devices as are required for attachment to the particular weapons replaceable assembly or shop replaceable assembly. In this kind of arrangement, it can be seen that the inexpensive portion of the two-component attachment assembly can be custom-manufactured by the hundreds much more conveniently and inexpensively, for custom attachment to any variety of unit under test (WRA or SRA).

In this arrangment, the expensive and labor and maintenance-intensive wiring, such as that shown at 86 in FIG. 5, has also been replaced, resulting in additional cost savings. The customized printed circuit board 182 thus includes a plurality of customized traces 186. These traces 186 provide the electrical connection between the spring pins 166 and the connection assembly 184, in whichever form the connection assembly 184 takes. Thus, the customized printed circuit board 182 is truly customized in that the traces 186 can be individually prepared in large numbers inexpensively to handle any required connection situation. In this way, the combination of the FLEX Adapter 160 and the interface test adapter 180 create a two-component attachment assembly including a single expensive FLEX adapter 160 and numerous custom-made inexpensive interface test adapters 180 which can be made to correspond to any particular connection requirements of the various weapons replaceable assemblies and shop replaceable assemblies being tested using the CASS system. The traces 186, besides being less expensive to produce, are typically much more reliable than the wires 86 which were provided in every individual interface device 80 of the prior art. In the new arrangement of the present invention, however, only the single set of wires 168 within the FLEX adapter 160 must be maintained, resulting in significant manufacturing and maintenance cost savings.

Referring now to FIGS. 9–12, the two-component attachment assembly of the present invention is shown in connection with a shop replaceable assembly of the type described and shown in connection with FIG. 4. With specific regard to FIG. 9, there is shown a front perspective view illustrating an interface test adapter ("ITA") of the present invention, generally at 200. The interface test adapter 200 includes a printed circuit board 202 having traces 204 in similar manner as previously described. Since this particular interface test adapter 200 is configured for the testing of a shop replaceable assembly, such as that shown at 50 in FIG. 4, the interface test adapter 200 includes first and second connection assemblies 206 and 208 for engagement with the functional connectors 54 and 56 of the shop replaceable assembly 50. A tray 210 is also provided for supporting the insertion of a shop replaceable assembly 50 into an engagement position with the first and second connection assemblies 206 and 208. A third connection assembly 212 is also provided for the attachment of a cable (not shown) which can be connected to the test connector 58 of a shop replaceable assembly 50 under test using this particular interface test adapter 200.

Figure 10:
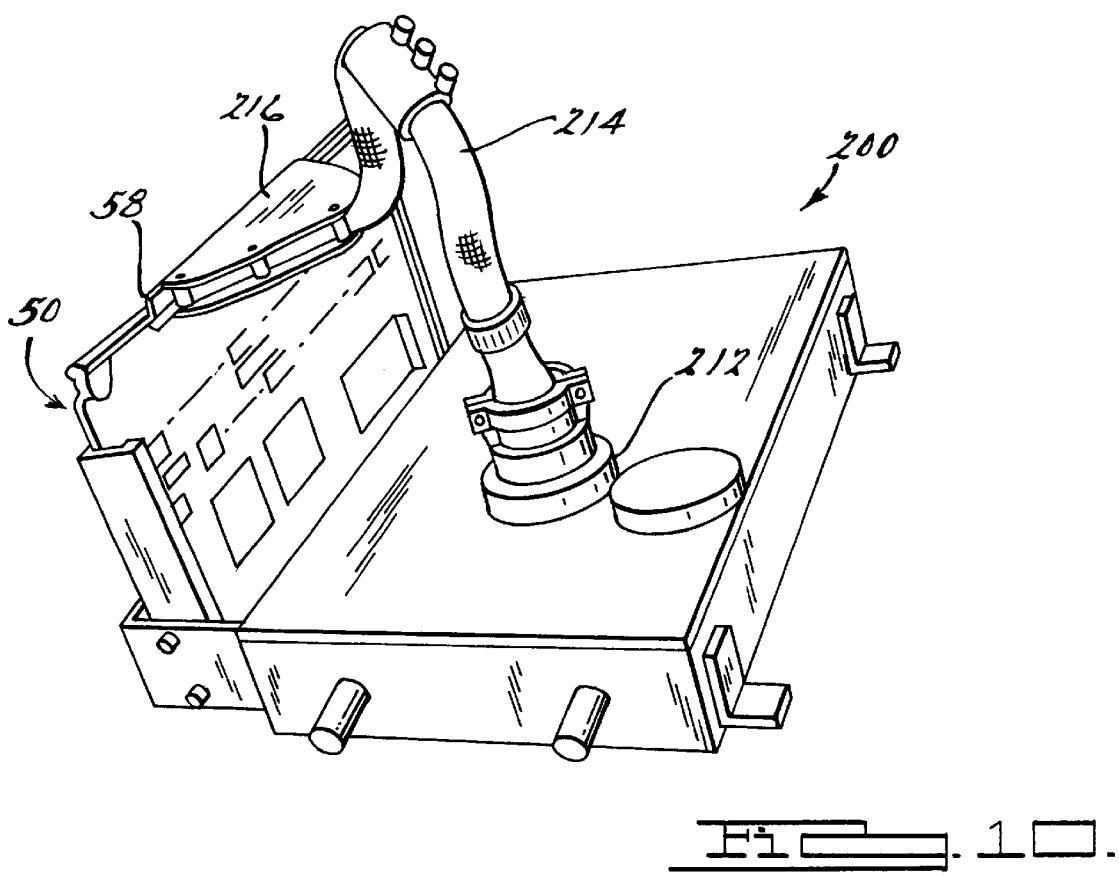
FIG. 10 is a front perspective view illustrating the interface test adapter ("ITA") of the present invention with an SRA attached thereto for testing purposes.

Referring now to FIG. 10, there is shown an interface test adapter generally at 200 with a shop replaceable assembly 50 connected thereto. Although not visible in FIG. 10, the functional connectors 54 and 56 of the shop replaceable assembly 50 are attached to the first and second connection assemblies 206 and 208 of the interface test adapter 200. Further, a cable 214 is attached to the third connection assembly 212 and includes a cable connector 216 at its distal end for attachment to the test connector 58 of the shop replaceable assembly 50.

Figure 11:
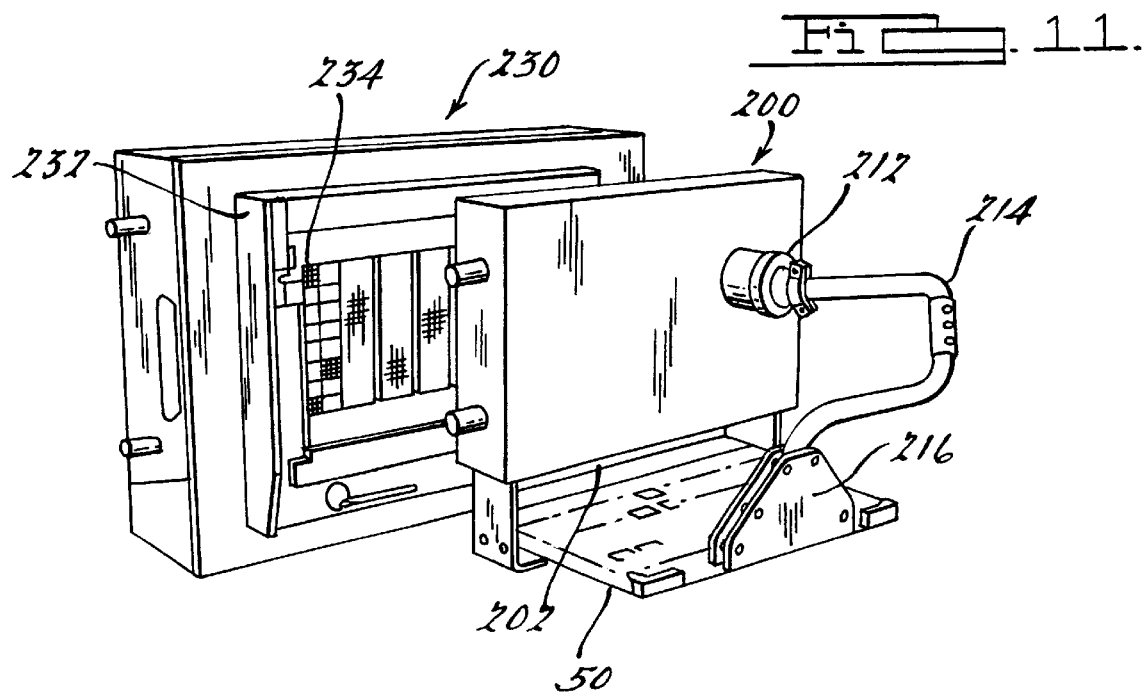
FIG. 11 is a front perspective view illustrating the interface test adapter ("ITA") of the present invention with an SRA attached thereto for testing purposes, as shown in FIG. 10, now placed adjacent a FLEX Adapter of the present invention that is used to interface with a CASS station GPI.

Referring now to FIG. 11, there is shown a front perspective view illustrating the interface test adapter 200 with a shop replaceable assembly 50 attached thereto for testing purposes. In this Figure, the interface test adapter 200 is now placed adjacent a FLEX Adapter, shown generally at 230. The FLEX Adapter 230 includes a universal spring pin assembly 232 which includes spring pins 234 in similar manner as previously described. On the reverse side of the FLEX Adapter 230 (not shown from this perspective), the FLEX Adapter 230 includes the universal male connection assembly (such as that shown at 162 in FIG. 8). In the testing operation, the interface test adapter 200 is mated with the universal spring pin assembly 232 to complete the connection between these assemblies.

Figure 12:
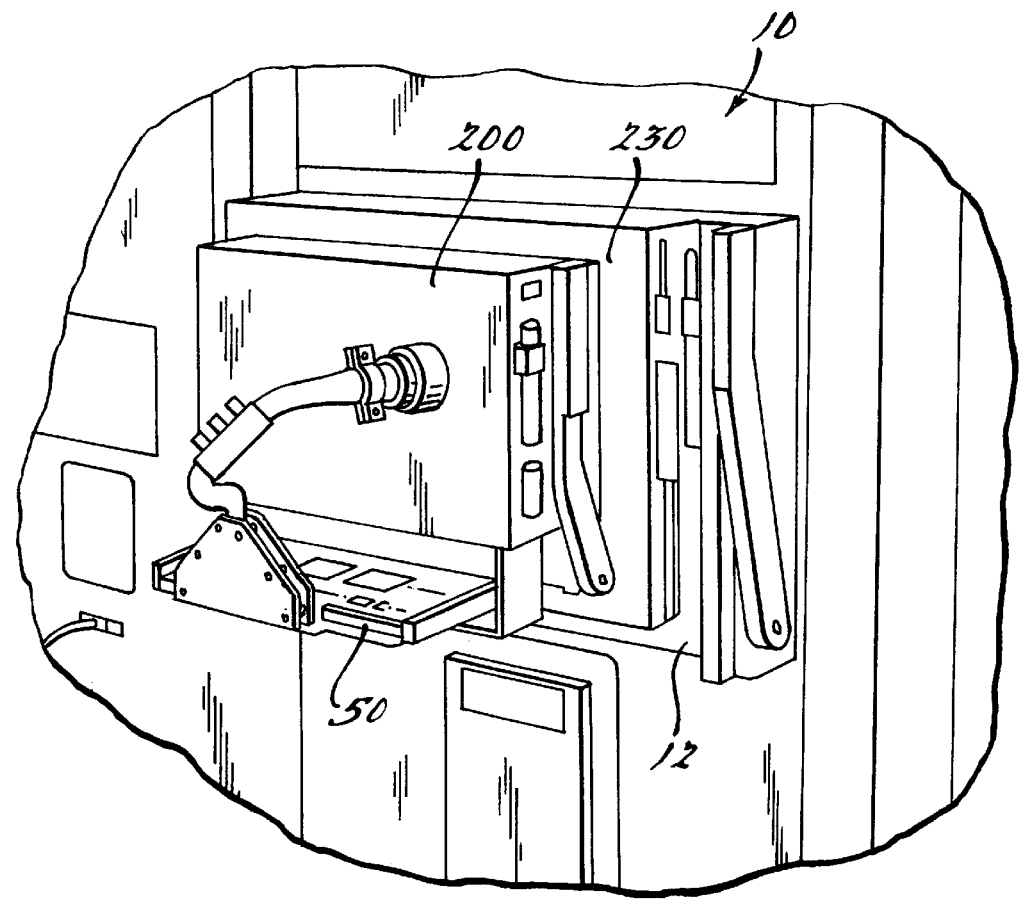
FIG. 12 is a front perspective view illustrating the interface test adapter ("ITA") and FLEX Adapter of the present invention, connected to each other, and attached to a CASS station GPI in a testing configuration.

Referring now to FIG. 12, the engaged arrangement between the interface test adapter 200 and the FLEX Adapter 230 is shown. In addition, the FLEX Adapter 230 is shown to be attached to the General Purpose Interface 12 of the CASS station 10. In this manner, testing of the shop replaceable assembly 50 can take place.

It will be appreciated that a similar arrangement for testing a weapons replaceable assembly, such as that shown at 30 in FIG. 3, is contemplated by this invention.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A two-component adapter assembly for electrically interfacing between an electronic unit under test to a General Purpose Interface of a CASS (Consolidated Automatic Support System) diagnostic test station, comprising:
    a first universal adapter component having a first universal connection assembly suitable for attachment to the General Purpose Interface and a second universal connection assembly disposed in electrical communication with the first universal connection assembly;
    a second adapter component suitable for electrically interfacing between the first universal adapter component and the electronic unit under test, the second adapter component customized for electrical interface with the electronic unit under test by being provided with individual customized connector assemblies for simultaneously interfacing with at least one test connector and at least one functional connector, the second adapter suitable for being manufactured in a plurality of customized varieties for interfacing with a plurality of electronic units under test when removably attached to the first universal adapter component.

2. The two-component adapter assembly according to claim 1, wherein the second adapter component comprises a customized printed circuit board imprinted with a plurality of customized electrical traces and a customized connection assembly attached to the customized printed circuit board for electrically interfacing with the electronic unit under test.

3. The two-component adapter assembly according to claim 1, wherein the electrical communication between the first and second universal connection assemblies is accomplished by a plurality of electrical wires disposed within the first universal adapter component.

4. The two-component adapter assembly according to claim 1, wherein the second universal connection assembly is a spring pin assembly comprising a plurality of dual-ended spring loaded pins.

5. The two-component adapter assembly according to claim 4, wherein the second adapter component includes an adapter connection assembly suitable for engaging the spring loaded pins of the second universal connection assembly.

6. The two-component adapter assembly according to claim 1, wherein the first universal adapter component is made in a single version for universal diagnostic testing of a plurality of units under test.

7. The two-component adapter assembly according to claim 1, wherein the assembly is suitable for replacing a plurality of customized single-component adapter assemblies used to interface directly between the General Purpose Interface and a unit under test.

8. The two-component adapter assembly according to claim 1, wherein the electronic unit under test is a military electronics unit located aboard a military asset and suitable for being removed from the military asset for testing purposes.

9. The two-component adapter assembly according to claim 1, wherein the electronic unit under test is a military electronics unit selected from the group consisting of a weapons replaceable assembly and a shop replaceable assembly.

10. The two-component adapter assembly according to claim 1, wherein the electronic unit under test comprises a military electronics weapons replaceable assembly which includes a connector assembly to which the second adapter component is customized for electrical interface.

11. The two-component adapter assembly according to claim 1, wherein the electronic unit under test comprises a military electronics shop replaceable assembly which includes at least one connector assembly selected from the group consisting of a functional connector and a test connector to which the second adapter component is customized for electrical interface.

12. The two-component adapter assembly according to claim 1, wherein the electronic unit under test comprises a military electronics shop replaceable assembly which includes at least one functional connector and at least one test connector to which the second adapter component is customized for electrical interface.

13. The two-component adapter assembly according to claim 1, wherein the electronic unit under test comprises a military electronics shop replaceable assembly which includes two functional connectors and one test connector to which the second adapter component is customized for electrical interface.

14. The two-component adapter assembly according to claim 1, wherein the second adapter component is customized for electrical interface with the electronic unit under test by being provided with a single customized connector assembly.

15. The two-component adapter assembly according to claim 1, wherein the second adapter component is customized for electrical interface with the electronic unit under test by being provided with a plurality of customized connector assemblies.

16. The two-component adapter assembly according to claim 12, wherein the second adapter component is customized for electrical interface with the electronic unit under test by being provided with a cable terminating in a customized connector assembly for interfacing with a test connector.

17. The two-component adapter assembly according to claim 1, wherein the second adapter component is suitable for interfacing with between 1 and 10 separate electronic units under test.

18. A method for electronically testing a military electronics unit located aboard a military asset, comprising the steps of:
    removing the military electronics unit from the military asset and bringing it to a CASS (Consolidated Automatic Support System) diagnostic test station having a General Purpose Interface;
    providing a two-component adapter assembly for electrically interfacing between the electronic unit under test and a General Purpose Interface of a CASS (Consolidated Automatic Support System) diagnostic test station, wherein the two-component adapter assembly comprises:
    (a) a first universal adapter component having a first universal connection assembly suitable for attachment to the General Purpose Interface and a second universal connection assembly disposed in electrical communication with the first universal connection assembly; and (b) a second adapter component including individual customized connector assemblies for simultaneously electrically interfacing between the first universal adapter component and the particular electronic unit under test;

attaching the first universal adapter component to the General Purpose Interface of the CASS station;

attaching the unit under test to the second adapter component;

attaching the individual customized connector assemblies of the second adapter component to the first universal adapter component, thereby completing a customized interface between the unit under test and the General Purpose Interface of the CASS station;

performing diagnostic tests using the CASS station upon the unit under test to determine defective electronic components upon the unit under test;

replacing defective electronic components upon the unit under test; and reinstalling the unit under test within the military asset.

* * * * *